United States Patent
Yamaguchi et al.

(10) Patent No.: US 10,588,230 B2
(45) Date of Patent: Mar. 10, 2020

(54) WATERPROOF LID, ELECTRONIC DEVICE, AND MANUFACTURING METHOD FOR WATERPROOF LID

(71) Applicant: FUJITSU LIMITED, Kawasaki-shi, Kanagawa (JP)

(72) Inventors: Shingo Yamaguchi, Kawasaki (JP); Hayato Shida, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/242,033

(22) Filed: Jan. 8, 2019

(65) Prior Publication Data

US 2019/0239373 A1 Aug. 1, 2019

(30) Foreign Application Priority Data

Feb. 1, 2018 (JP) .................... 2018-016414

(51) Int. Cl.
*H05K 5/06* (2006.01)
*H05K 5/02* (2006.01)
*H04M 1/02* (2006.01)

(52) U.S. Cl.
CPC .............. *H05K 5/061* (2013.01); *H04M 1/02* (2013.01); *H05K 5/0239* (2013.01); *H05K 5/069* (2013.01)

(58) Field of Classification Search
CPC .......... H04M 1/02; H04M 1/18; H05K 5/069; H05K 5/0239; H05K 5/061; G06F 1/1626; H01R 13/5213; H01R 13/447; H01R 13/5202; H01R 2201/16; H01R 13/52; H01R 13/5219
See application file for complete search history.

(56) References Cited

U.S. PATENT DOCUMENTS

| | | | | |
|---|---|---|---|---|
| 6,991,490 B1 * | 1/2006 | Su | ...................... | H01R 13/5213 439/136 |
| 7,742,294 B2 * | 6/2010 | Gadau | .................. | G06F 1/1616 361/679.4 |
| 8,223,484 B2 * | 7/2012 | Zhu | ...................... | H04M 1/0262 361/679.01 |
| 9,084,352 B2 * | 7/2015 | Shinmura | ............... | H04M 1/18 |
| 9,326,403 B2 * | 4/2016 | Xie | ...................... | H05K 5/0239 |
| 9,560,782 B2 * | 1/2017 | Lee | ...................... | H05K 5/0239 |
| 9,668,370 B1 * | 5/2017 | Huang | ................ | G06F 1/1656 |
| 9,843,659 B2 * | 12/2017 | Yamaguchi | ........... | H04M 1/035 |
| 10,007,301 B2 * | 6/2018 | Iwamoto | .............. | H05K 5/0226 |
| 10,050,374 B1 * | 8/2018 | Lee | ...................... | G06F 1/1656 |
| 10,429,898 B2 * | 10/2019 | Yoshioka | ............ | H04M 1/0202 |
| 2002/0119697 A1 * | 8/2002 | Chan | .................. | H01R 13/5213 439/519 |
| 2009/0109635 A1 * | 4/2009 | Chen | ..................... | G06F 1/1626 361/728 |
| 2009/0111539 A1 * | 4/2009 | Matsuda | ............... | G06F 1/1616 455/575.3 |

(Continued)

FOREIGN PATENT DOCUMENTS

| | | |
|---|---|---|
| JP | 2003-247644 | 9/2003 |
| JP | 2013-46218 | 3/2013 |
| JP | 2014-38944 | 2/2014 |

*Primary Examiner* — Abhishek M Rathod
(74) *Attorney, Agent, or Firm* — Fujitsu Patent Center

(57) ABSTRACT

A waterproof lid includes: a lid body; and a sealant made of rubber and including a first portion which adheres to the lid body and a second portion is in contact with the lid body in a non-adhesive state.

14 Claims, 9 Drawing Sheets

(56) References Cited

U.S. PATENT DOCUMENTS

| | | | | |
|---|---|---|---|---|
| 2010/0264671 A1* | 10/2010 | Zuo | .................... | H04M 1/0274 |
| | | | | 292/57 |
| 2010/0309613 A1* | 12/2010 | Zuo | ..................... | H01R 13/447 |
| | | | | 361/679.01 |
| 2011/0032664 A1* | 2/2011 | Long | ................... | H04M 1/0274 |
| | | | | 361/679.01 |
| 2013/0244737 A1* | 9/2013 | Tanaka | ............... | H01R 13/5213 |
| | | | | 455/575.1 |
| 2013/0293073 A1* | 11/2013 | Tsai | .................... | H05K 5/0239 |
| | | | | 312/229 |
| 2013/0330951 A1* | 12/2013 | Yudate | ............... | H01R 13/5202 |
| | | | | 439/271 |
| 2014/0080334 A1* | 3/2014 | Tetsuya | ............. | H01R 13/5213 |
| | | | | 439/136 |
| 2014/0084770 A1* | 3/2014 | Tsai | ..................... | G06F 1/1679 |
| | | | | 312/326 |
| 2014/0085784 A1* | 3/2014 | Lee | ..................... | H05K 5/0221 |
| | | | | 361/679.01 |
| 2014/0113467 A1* | 4/2014 | Senatori | ................ | G06F 1/1633 |
| | | | | 439/142 |
| 2015/0022955 A1* | 1/2015 | Yamaguchi | .......... | H05K 5/0239 |
| | | | | 361/679.01 |
| 2016/0027465 A1* | 1/2016 | Lee | ........................ | G11B 17/04 |
| | | | | 720/613 |
| 2018/0210501 A1* | 7/2018 | Kanbayashi | .......... | G06F 1/1656 |

\* cited by examiner ions in the claims.

It is to be understood that both the foregoing general description and the following detailed description are exemplary and explanatory and are not restrictive of the invention.

WATERPROOF LID, ELECTRONIC DEVICE, AND MANUFACTURING METHOD FOR WATERPROOF LID

CROSS-REFERENCE TO RELATED APPLICATION

This application is based upon and claims the benefit of priority of the prior Japanese Patent Application No. 2018-16414, filed on Feb. 1, 2018, the entire contents of which are incorporated herein by reference.

FIELD

The embodiments discussed herein are related to a waterproof lid, an electronic device, and a manufacturing method for the waterproof lid.

BACKGROUND

An electronic device having a casing with an opening and a lid for blocking the opening is provided.

Related art is disclosed in Japanese Laid-open Patent Publication No. 2003-247644, Japanese Laid-open Patent Publication No. 2013-46218, and Japanese Laid-open Patent Publication No. 2014-38944.

SUMMARY

According to an aspect of the embodiments,

A waterproof lid includes: a lid body; and a sealant made of rubber and including a first portion which adheres to the lid body and a second portion is in contact with the lid body in a non-adhesive state.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In an electronic device having a casing with an opening and a lid for blocking the opening, when the waterproofness of the lid is required to be ensured, a sealant is provided on the lid. In the electronic device in which the sealant is provided on the lid as described above, the sealant is pressed against an edge portion of the opening while the lid is closed and the sealant is interposed between the edge portion of the opening and the lid in a compressively deformed state, such that the waterproofness of the lid is successfully ensured.

However, if the repulsive force of the compressively deformed sealant is strong while the lid is closed, the edge portion of the opening and the lid are deformed by the repulsive force of the sealant and, as a result, there is a possibility that the waterproofness of the lid is lowered.

For example, in order to restrain an increase in deflection deformation generated in a plate by a repulsive load at the time of compression of a packing, a recess is formed on a plate affixing surface of the packing. For example, since the packing is elastically deformed with ease during compression because of the recess formed on the plate affixing surface, the repulsive load of the packing may be reduced. However, when the recess is formed on the plate affixing surface of the packing in this manner, the area of the plate affixing surface is decreased, such that it is difficult to improve the waterproofness.

For example, a waterproof lid capable of improving waterproofness.

Hereinafter, an embodiment of the technique disclosed in the present application will be described.

Figure 1:
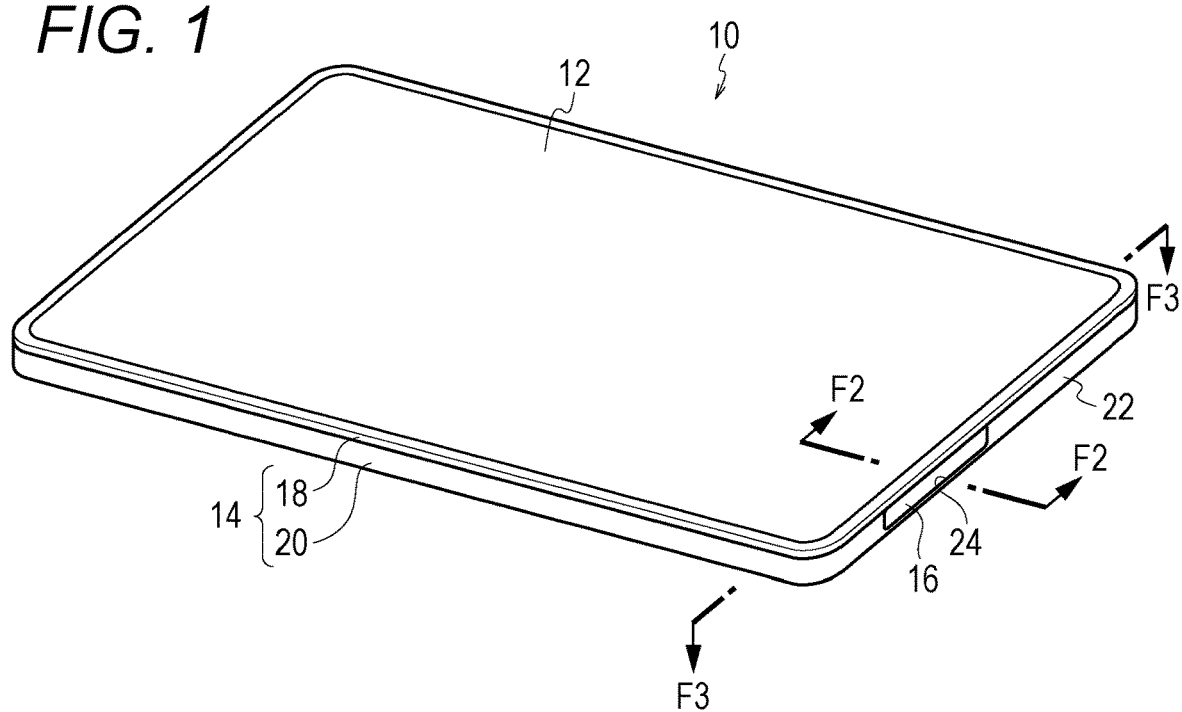
FIG. 1 is a perspective view of an electronic device according to one embodiment of the technique disclosed in the present application.

An electronic device 10 according to the present embodiment illustrated in FIG. 1 is, for example, a smartphone. The electronic device 10 includes a display unit 12, a casing 14, and a waterproof lid 16.

The casing 14 is formed in a flat plate shape having a rectangular shape in plan view. The casing 14 includes a first case 18 and a second case 20. The first case 18 and the second case 20 are divided in a thickness direction of the casing 14. The display unit 12 is assembled in the first case 18. The first case 18 is formed in a frame shape along an outer periphery of the display unit 12, while the second case 20 is formed in a shallow container shape opening on the side of the display unit 12.

Figure 2:
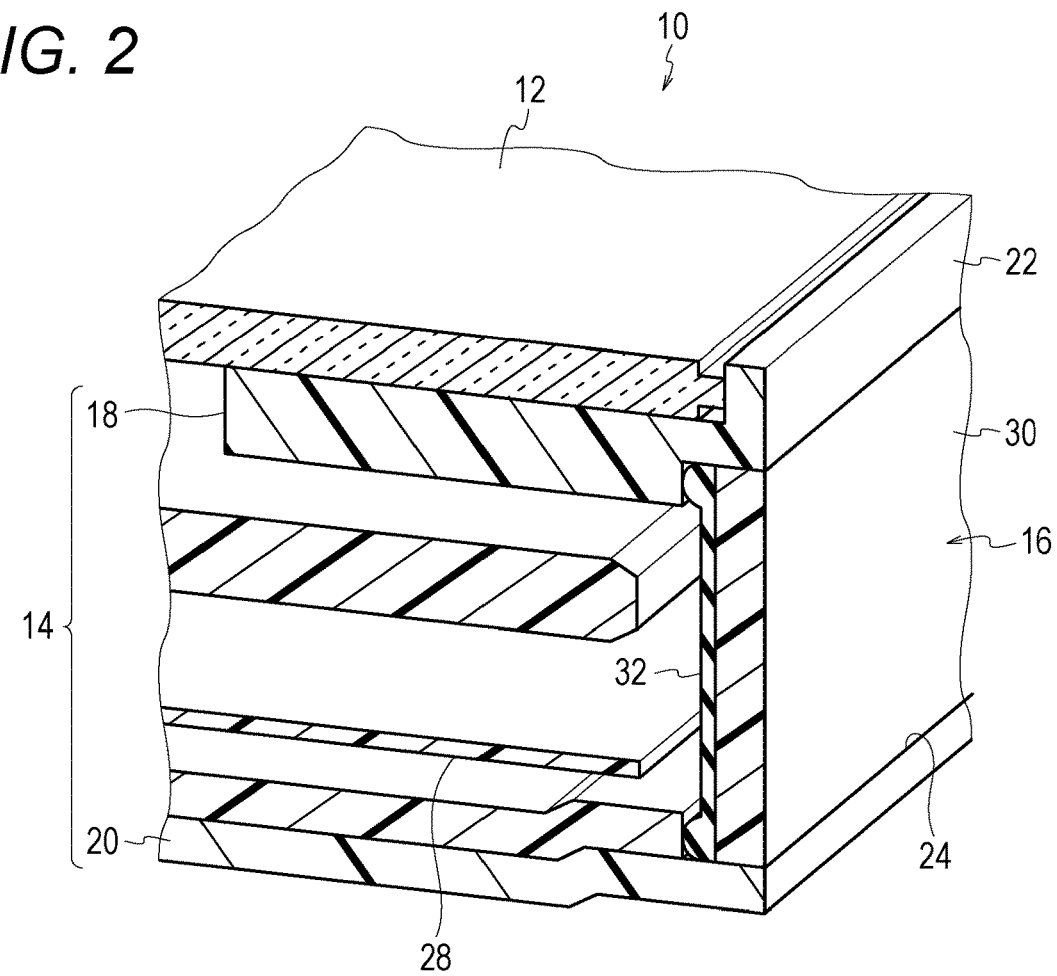
FIG. 2 is a cross-sectional view taken along line F2-F2 in FIG. 1.
Figure 3:
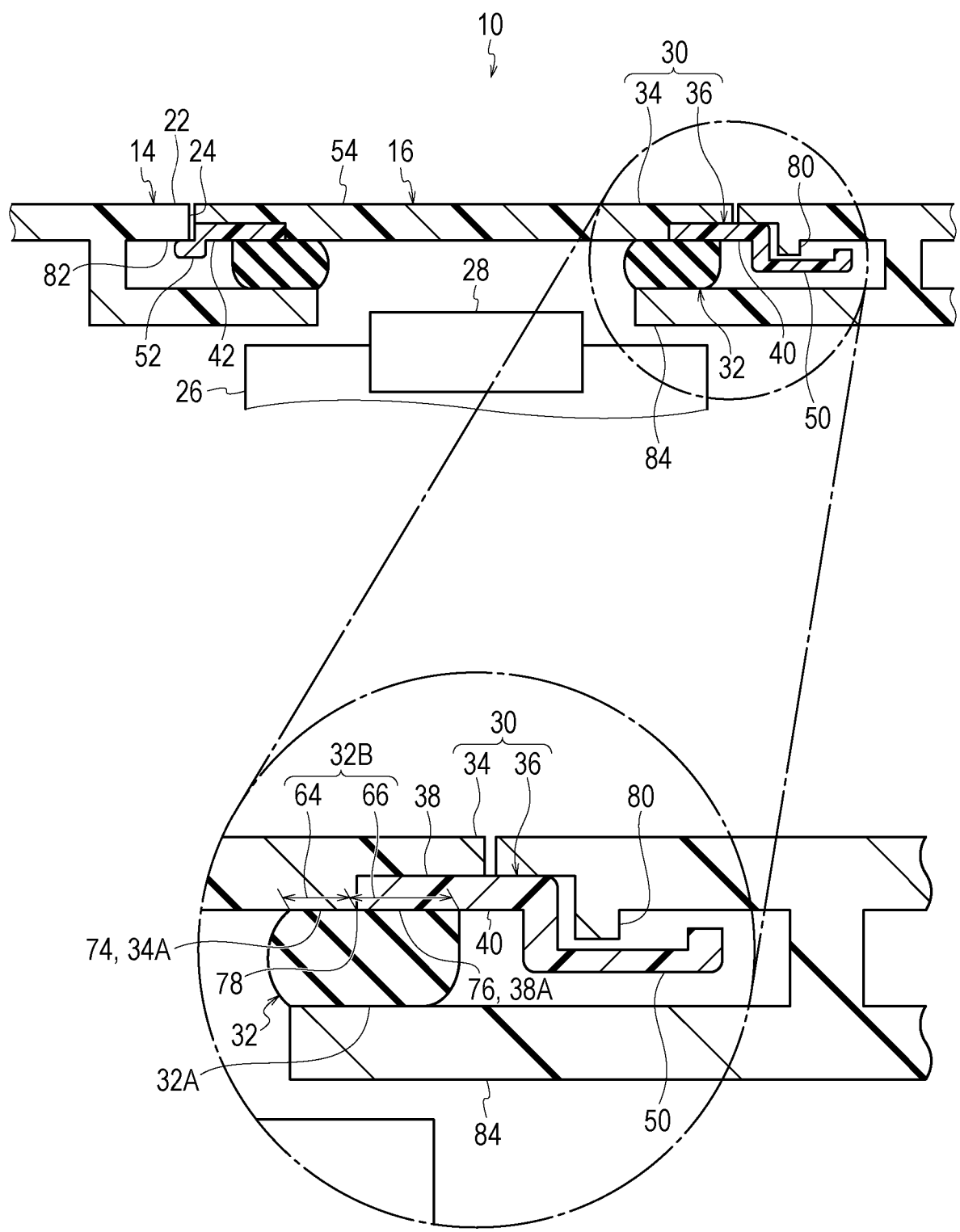
FIG. 3 is a cross-sectional view taken along line F3-F3 in FIG. 1.

As illustrated in FIGS. 2 and 3, an opening 24 is formed on one side surface 22 of four side surfaces formed in the casing 14. A substrate 26 (see FIG. 3) is accommodated inside the casing 14 and a connector 28 is disposed on the substrate 26. The connector 28 is, for example, a connector having a universal serial bus (USB) terminal. The connector 28 opposes the opening 24 from the inside of the casing 14. The waterproof lid 16 is provided in the opening 24.

Figure 4:
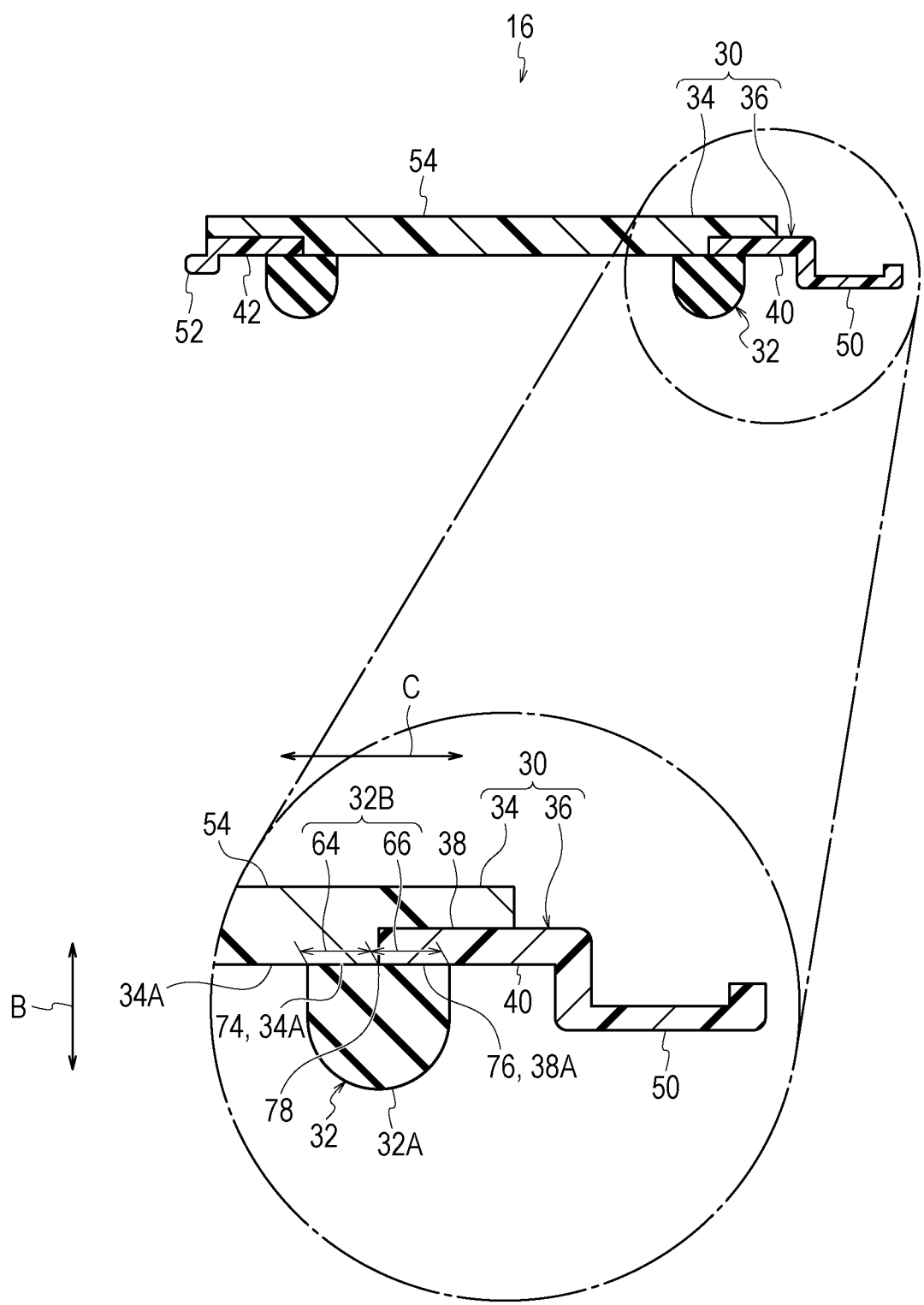
FIG. 4 is a cross-sectional view illustrating a waterproof lid in FIG. 3 alone.
Figure 5:
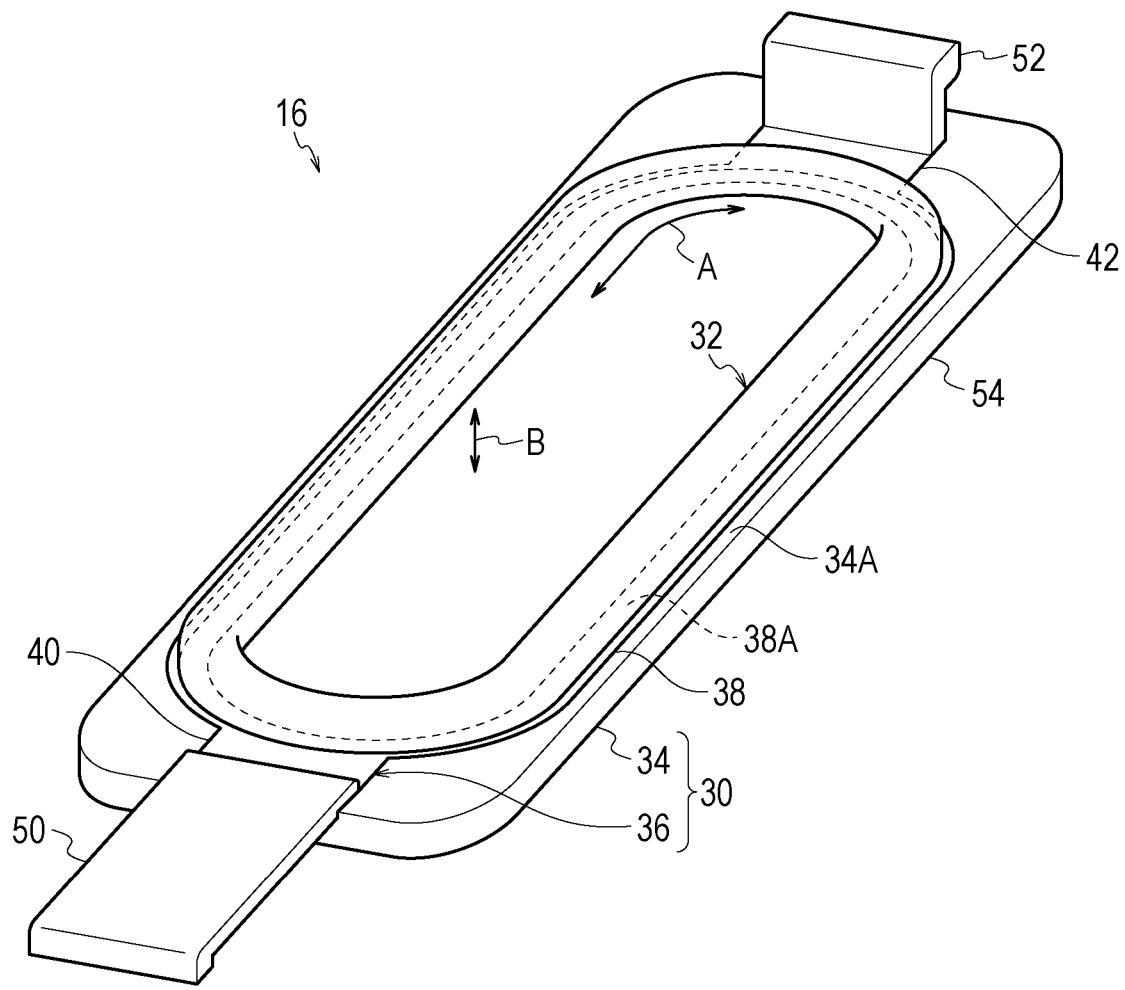
FIG. 5 is a perspective view of the waterproof lid in FIG. 4 as viewed from a back side.
Figure 6:
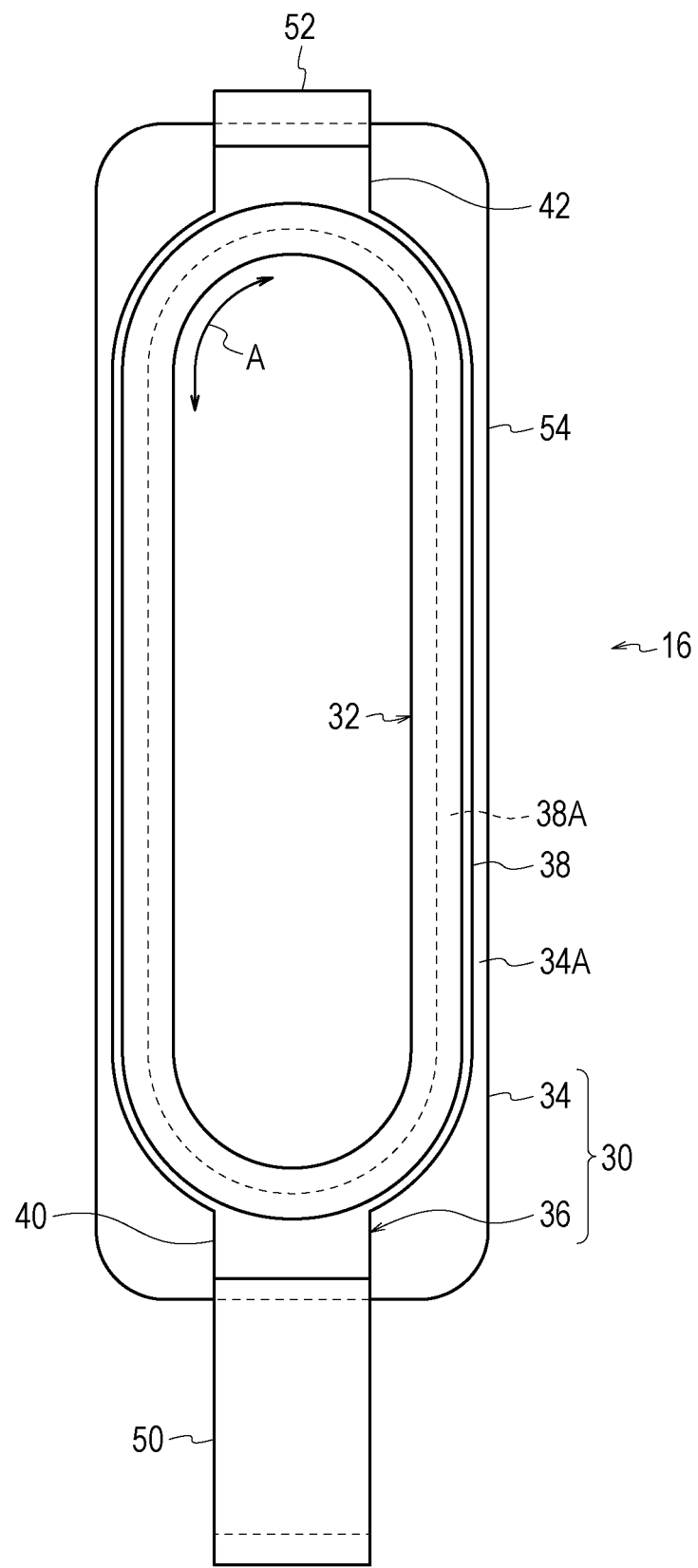
FIG. 6 is a plan view of the waterproof lid in FIG. 4 as viewed from the back side.

As illustrated in FIGS. 4 to 6, the waterproof lid 16 includes a lid body 30 and a sealant 32. The lid body 30 corresponds to a portion obtained by removing the sealant 32 from the waterproof lid 16 and has a first member 34 and a second member 36.

Figure 7:
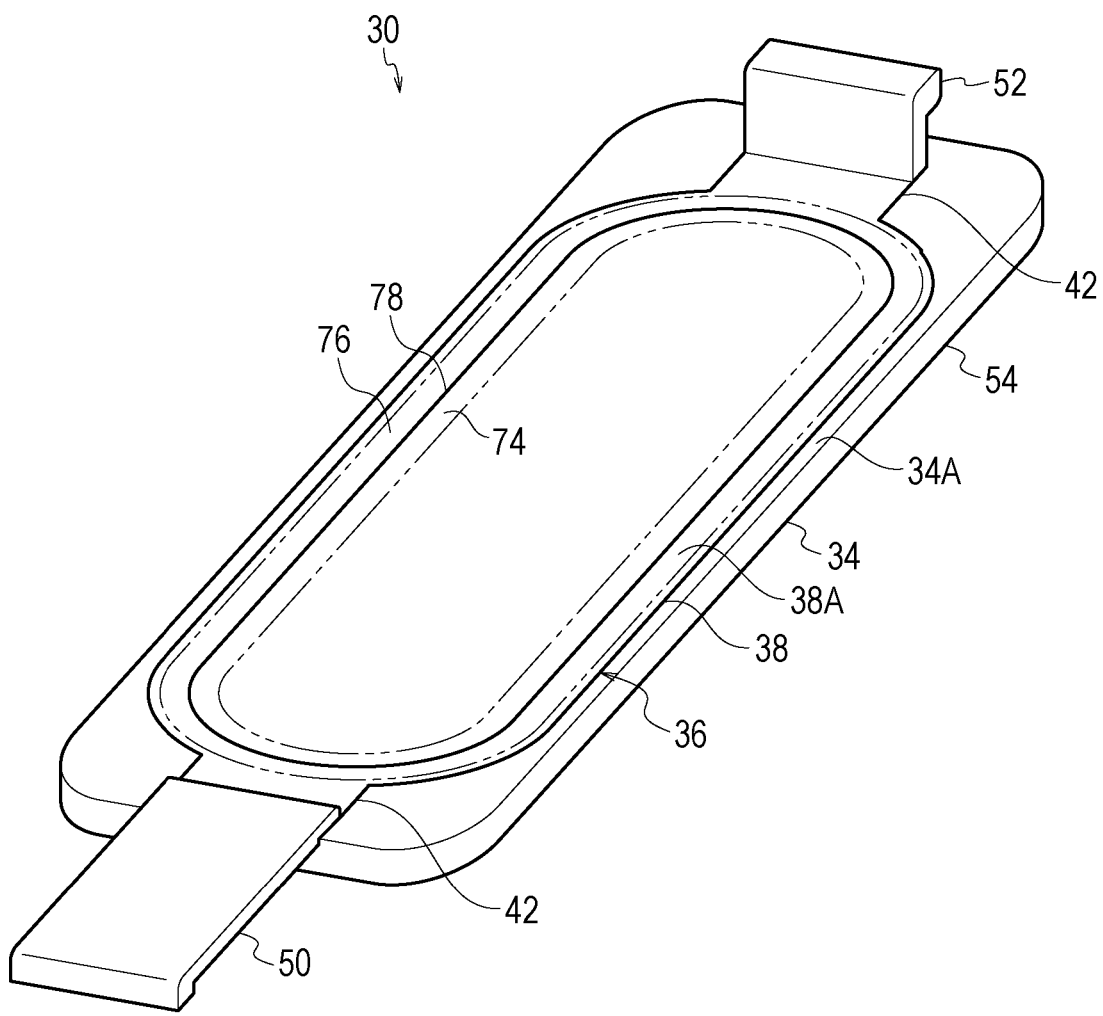
FIG. 7 is a perspective view illustrating a lid body alone obtained by removing a sealant from the waterproof lid in FIG. 4.

As illustrated in FIG. 7, the first member 34 is formed in a flat plate shape having a rectangular shape in plan view. The first member 34 is formed to have a size that blocks the above-described opening 24 (see FIGS. 2 and 3). The second member 36 is integrated with the first member 34 by, for example, two-color molding or insert molding. The second member 36 has an annular portion 38, a first holding portion 40, and a second holding portion 42.

The annular portion 38 is formed in an annular shape having an elliptical shape in plan view. The annular portion 38 is located inside an outer shape of the first member 34 and is provided along the outer shape of the first member 34. The width of the annular portion 38 is consistent over the entire circumference in a circumferential direction of the annular portion 38. The annular portion 38 has an exposed surface 38A exposed on a back surface 34A of the flat plate-like first member 34. The back surface 34A and the exposed surface 38A are planar.

The first holding portion 40 and the second holding portion 42 are an example of a "holding portion". The first holding portion 40 protrudes from one end portion of the annular portion 38 in a line-of-apsides direction toward the outside of the annular portion 38, while the second holding portion 42 protrudes from another end portion of the annular portion 38 in the line-of-apsides direction toward the outside of the annular portion 38.

A first claw portion 50 is formed on a distal end side of the first holding portion 40 in a protruding direction and a second claw portion 52 is formed on a distal end side of the second holding portion 42 in a protruding direction. The first claw portion 50 protrudes from the flat plate-like first member 34 to one side in a longitudinal direction of the first member 34 and the second claw portion 52 protrudes from the flat plate-like first member 34 to another side in the longitudinal direction of the first member 34.

A portion of the above-described lid body 30 excluding the first holding portion 40 and the second holding portion 42 forms a plate-like portion 54 having a flat plate shape. For example, the annular portion 38 of the second member 36 is integrated with the flat plate-like first member 34, thereby forming the plate-like portion 54 having a flat plate shape together with the first member 34.

As illustrated in FIGS. 5 and 6, the sealant 32 is annularly provided along the above-described annular portion 38. For example, the sealant 32 is formed in an annular shape having an elliptical shape in plan view. Directions of arrows A in FIGS. 5 and 6 correspond to the circumferential direction of the sealant 32. As illustrated in FIG. 4, the sealant 32 protrudes from the plate-like portion 54 with a normal direction of the plate-like portion 54 as a height direction. The sealant 32 protrudes to a side where the above-described exposed surface 38A is exposed, for example, the back side of the lid body 30. Directions of arrows B in FIGS. 4 and 5 correspond to the height direction of the sealant 32.

As will be described in detail later, the sealant 32 is formed by curing rubber applied by a dispenser over a first region 74 and a second region 76 (see FIG. 8). For example, the sealant 32 is an applied rubber curing type gasket formed of rubber. Such an applied rubber curing type gasket is sometimes referred to as a cured-in-place gasket (CIPG). Because of the property of the applied rubber curing type gasket at the time of manufacturing, namely, because of the property that the surface tension acts on a distal end portion of rubber when the applied rubber is cured, a distal end portion 32A of the sealant 32 in the height direction has a convexly curved shape. In addition, a rubber having hardness lower than that of usual rubber such as silicone rubber is applied to the sealant 32.

As illustrated in FIG. 4, a proximal end portion 32B of the sealant 32 in the height direction corresponds to a fixing portion to the plate-like portion 54 of the lid body 30 and includes a first portion 64 and a second portion 66. A direction of an arrow C in FIG. 4 corresponds to a width direction of the sealant 32. The width direction of the sealant 32 corresponds to a direction orthogonal to the protruding direction of the sealant 32 as viewed in the circumferential direction of the sealant 32.

The first portion 64 is formed on one side of the sealant 32 in the width direction and the second portion 66 is formed on another side of the sealant 32 in the width direction. The second portion 66 is adjacent to the first portion 64. The sealant 32 is formed to have a consistent cross-sectional shape over the entire circumference in the circumferential direction.

The plate-like portion 54 of the lid body 30 has the first region 74 opposing the first portion 64 and the second region 76 opposing the second portion 66. The second region 76 corresponds to the exposed surface 38A of the annular portion 38 formed in the second member 36 and the first region 74 corresponds to a region of the back surface 34A of the first member 34 adjacent to the second region 76.

The entirety of the first member 34 including the first region 74 is formed of a material having adhesiveness to rubber in response to the formation of the sealant 32 by curing of the applied rubber. Since the first region 74 has adhesiveness to rubber, the first portion 64 formed by curing the rubber applied to the first region 74 adheres to the first region 74. As a material applied to the first member 34 (a material having adhesiveness to rubber), for example, polycarbonate (PC), polycarbonate+acrylonitrile butadiene styrene-mixed resin (PC+ABS resin), and the like are exemplified.

For example, the first portion 64 adheres to the first region 74 by integrating the boundary of the first portion 64 and the boundary of the first region 74 with each other. In the present embodiment, the term "adhere" means a state in which the boundary of the first portion 64 and the boundary of the first region 74 are integrated with each other because of, for example, chemical reaction between the material of the first portion 64 and the material of the first region 74 without using a bonding agent. Since the boundary of the first portion 64 and the boundary of the first region 74 are integrated with each other, the sealant 32 is no longer peeled off even when the sealant 32 is pulled. For example, even when the sealant 32 is pulled, the sealant 32 does not peel off but the sealant 32 breaks.

On the other hand, the entirety of the second member 36 including the second region 76 is formed of a material having non-adhesiveness to rubber. Since the second region 76 has non-adhesiveness to rubber, the second portion 66 formed by curing the rubber applied to the second region 76 is in contact with the second region 76 in a non-adhesive state. As a material applied to the second member 36 (a material having non-adhesiveness to rubber), a resin such as a synthetic resin other than the above-mentioned materials used for the first member 34, a polyamide synthetic resin, or an elastomer resin, and metal such as aluminum or stainless steel are exemplified.

For example, the second portion 66 is in contact with the second region 76 in a non-adhesive state because the boundary of the first portion 64 and the boundary of the first region 74 are separated. In the present embodiment, the term "non-adhesive state" means a state in which the boundary of the first portion 64 and the boundary of the first region 74 are separated from each other because no chemical reaction occurs between the material of the first portion 64 and the material of the first region 74. Since the boundary of the first portion 64 and the boundary of the first region 74 are separated from each other, the second portion 66 is kept in contact with the second region 76 so as to be slidably movable.

A dividing line 78 between the first region 74 and the second region 76 is annular and the sealant 32 is annular along the dividing line 78. The dividing line 78 is located within the range of the sealant 32 in the width direction. In addition, the first portion 64 and the second portion 66 are parallel to the dividing line 78. As an example, the first region 74 and the first portion 64 are located on an inner circumferential side of the sealant 32 (inside the dividing line 78) and the second region 76 and the second portion 66 are located on an outer circumferential side of the sealant 32 (outside the dividing line 78).

As illustrated in FIG. 3, the above waterproof lid 16 is attached to the casing 14. A first locking portion 80 and a second locking portion 82 are formed in the casing 14. The first locking portion 80 is located on one side of the opening 24 in a lateral width direction and the second locking portion 82 is located on another side of the opening 24 in the lateral width direction. The first holding portion 40 of the waterproof lid 16 is held by the casing 14 as the first claw portion 50 is locked with the first locking portion 80 and the second holding portion 42 of the waterproof lid 16 is held by the casing 14 as the second claw portion 52 is locked with the second locking portion 82.

In this manner, by holding the first holding portion 40 and the second holding portion 42 in the casing 14, the waterproof lid 16 is attached to the casing 14. In a state where the waterproof lid 16 is attached to the casing 14, the opening 24 of the casing 14 is blocked by the lid body 30 (the plate-like portion 54) of the waterproof lid 16.

An opposing wall 84 opposing the above-described sealant 32 is formed in the casing 14. The opposing wall 84 is annularly formed along an edge portion of the opening 24. While the waterproof lid 16 is attached to the casing 14 and the waterproof lid 16 is closed, the distal end portion 32A of the sealant 32 is pressed against the opposing wall 84. When the distal end portion 32A of the sealant 32 is pressed against the opposing wall 84 in this manner, the sealant 32 is interposed between the opposing wall 84 and the lid body 30 in a compressively deformed state, whereby the waterproofness of the waterproof lid 16 is ensured. The waterproof lid 16 is allowed to be repeatedly opened and closed.

Here, as described at the beginning, if the repulsive force of the compressively deformed sealant 32 is strong while the waterproof lid 16 is closed, the edge portion of the opening 24 and the lid body 30 are deformed by the repulsive force of the sealant 32 and, as a result, there is a possibility that the waterproofness of the waterproof lid 16 is lowered.

For example, if the external dimensions and wall thickness dimensions of the casing 14 are made as small as possible in order to achieve downsizing and thinning of the electronic device 10, the rigidity of the casing 14 and the waterproof lid 16 is lowered. Therefore, in the downsized and thinned electronic device 10, the edge portion of the opening 24 and the lid body 30 is easy to deform and the waterproofness of the waterproof lid 16 tends to be lowered. Furthermore, the sealant 32 is formed by curing rubber applied by a dispenser. For this reason, it is difficult to add a shape such as a recess or a groove for reducing the repulsive force to the sealant 32 and, when the sealant 32 is compressively deformed, a strong repulsive force tends to be generated.

However, in the waterproof lid 16 of the present embodiment, the first portion 64 of the proximal end portion 32B of the sealant 32 adheres to the first region 74 of the lid body 30, and the second portion 66 of the proximal end portion 32B of the sealant 32 is in contact with the second region 76 of the lid body 30 in a non-adhesive state. Therefore, even if the distal end portion 32A of the sealant 32 is pressed against the opposing wall 84, the second portion 66 slidably moves with respect to the second region 76, such that the sealant 32 deforms in the width direction. With this deformation of the sealant 32, the repulsive force of the sealant 32 in the height direction is reduced, whereby the deformation of the edge portion of the opening 24 and the lid body 30 are suppressed. In addition, since the second portion 66 is kept in contact with the second region 76, a contact area between the sealant 32 and the lid body 30 is ensured. As a result, the waterproofness of the waterproof lid 16 is improved.

Next, a manufacturing method for the waterproof lid 16 according to the present embodiment will be described.

The manufacturing method for the waterproof lid 16 according to the present embodiment includes a rubber application process and a rubber curing process as described below.

(Rubber Application Process)

Figure 8:
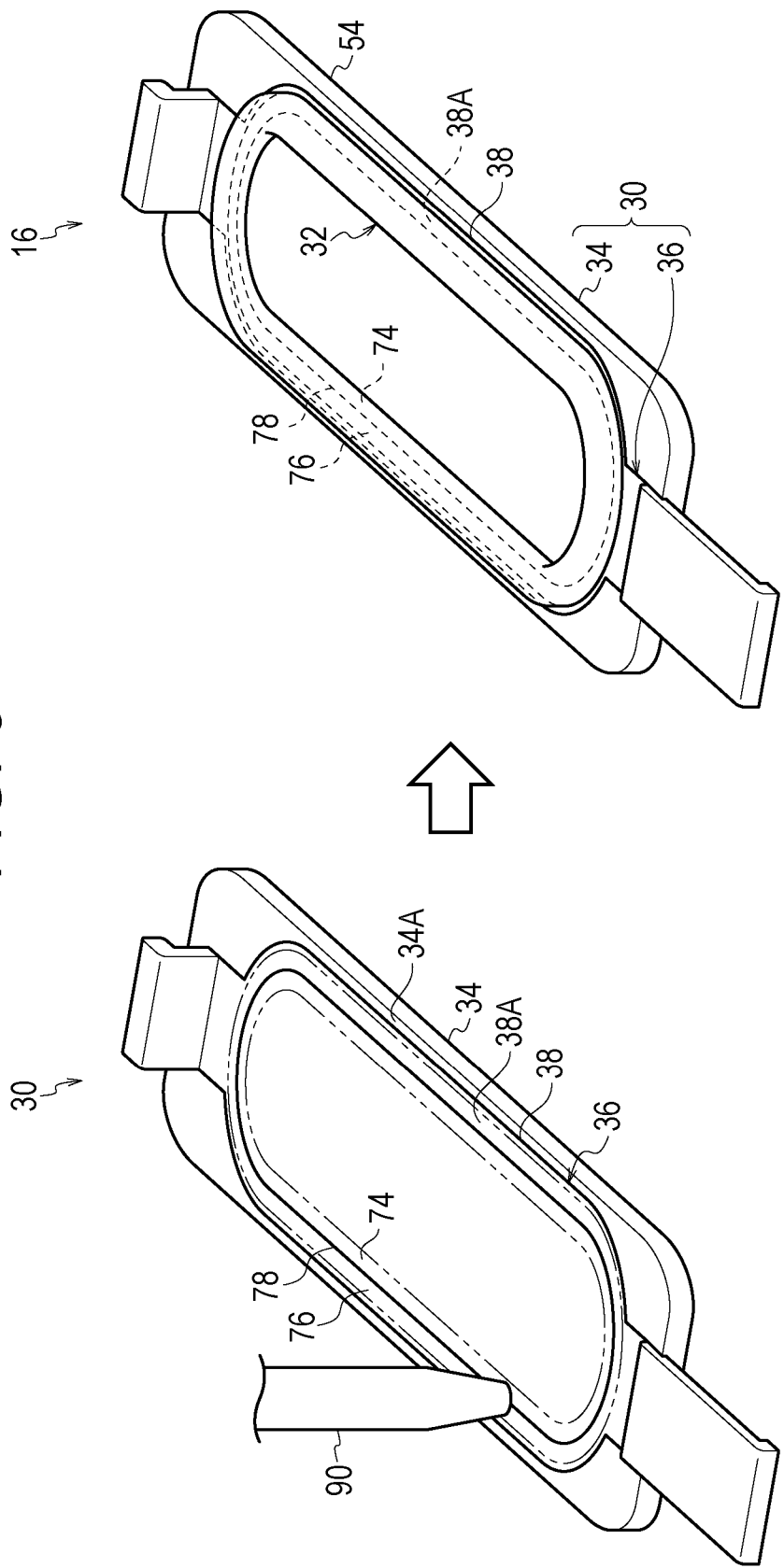
FIG. 8 is a view for explaining a manufacturing method for the waterproof lid in FIG. 4.

As illustrated on the left side of FIG. 8, a dispenser 90 is used in the rubber application process. Then, while supplying rubber through the dispenser 90, the dispenser 90 is moved to apply rubber over the first region 74 and the second region 76. Rubber such as ultraviolet (UV) curing type, two-liquid mixing type, moisture curing type, or thermosetting type is applied to the rubber. In this rubber application process, rubber is applied inside the outer edge of the annular portion 38 such that the rubber supplied from the dispenser 90 does not project from the outer edge of the annular portion 38.

(Rubber Curing Process)

Subsequently, as illustrated on the right side of FIG. 8, the rubber is cured in the rubber curing process. Since the first region 74 is formed of a material having adhesiveness to rubber, when the rubber is cured, the first portion 64 of the proximal end portion 32B of the sealant 32 adheres to the first region 74 of the lid body 30, as illustrated in FIG. 4. On the other hand, since the second region 76 is formed of a material having non-adhesiveness to rubber, when the rubber is cured, the second portion 66 of the proximal end portion 32B of the sealant 32 makes contact with the second region 76 of the lid body 30 in a non-adhesive state. Then, when the sealant 32 is formed by the cured rubber, the waterproof lid 16 including the lid body 30 and the sealant 32 is obtained.

Next, operations and effects of the present embodiment will be described.

As described thus far in detail, according to the present embodiment, the first portion 64 of the proximal end portion 32B of the sealant 32 adheres to the first region 74 of the lid body 30, and the second portion 66 of the proximal end portion 32B of the sealant 32 is in contact with the second region 76 of the lid body 30 in a non-adhesive state. Therefore, as illustrated in FIG. 3, even if the waterproof lid 16 is closed and the distal end portion 32A of the sealant 32 is pressed against the opposing wall 84, the second portion 66 slidably moves with respect to the second region 76, such that the sealant 32 deforms in the width direction. With this deformation of the sealant 32, the repulsive force of the sealant 32 in the height direction is reduced, whereby deformation of the edge portion of the opening 24 and the lid body 30 may be suppressed. In addition, since the second portion 66 is kept in contact with the second region 76, a contact area between the sealant 32 and the lid body 30 may be ensured. As a result, the waterproofness of the waterproof lid 16 may be improved.

Furthermore, according to the present embodiment, the lid body 30 has the first region 74 having adhesiveness to rubber and the second region 76 having non-adhesiveness to rubber. Therefore, by applying rubber over the first region 74 and the second region 76 and additionally curing the rubber, the sealant 32 having the first portion 64 adhering to the first region 74 and the second portion 66 in contact with the second region 76 in a non-adhesive state is obtained. This diminishes the need for a dedicated process for bringing the second portion 66 and the second region 76 into contact with each other in a non-adhesive state, such that the cost may be brought down.

According to the present embodiment, the lid body 30 includes the plate-like first member 34, and the second member 36 having the first holding portion 40 and the second holding portion 42 to be held by the casing 14 of the electronic device 10. The first region 74 is formed in the first member 34 and the second region 76 is formed in the second member 36. With this structure, the lid body 30 having the first region 74 having adhesiveness to rubber and the second region 76 having non-adhesiveness to rubber may be implemented with a simple configuration using the plate-like first member 34 and the second member 36 having the first holding portion 40 and the second holding portion 42. Therefore, the cost may be brought down by this configuration as well.

According to the present embodiment, an applied rubber curing type gasket formed of rubber is used as the sealant 32. Therefore, the boundary of the first portion 64 of the sealant 32 is integrated with the boundary of the first region 74, whereby the first portion 64 firmly adheres to the first region 74. Consequently, a firm adhesion that may withstand the repeated opening and closing of the waterproof lid 16 is achieved.

According to the present embodiment, the repulsive force of the sealant 32 in the height direction may be reduced as described earlier. Therefore, the structure such as a claw for keeping the compression of the sealant 32 may be omitted with ease, such that space saving is achieved. Furthermore, by reducing the repulsive force of the sealant 32 in the height direction, the thickness dimensions of the opposing wall 84 and the lid body 30 may be made smaller, such that space saving is achieved by the smaller thickness dimensions as well.

Here, the operations and effects of the present embodiment will be further clarified by comparing the present embodiment with a comparative example.

Figure 9:
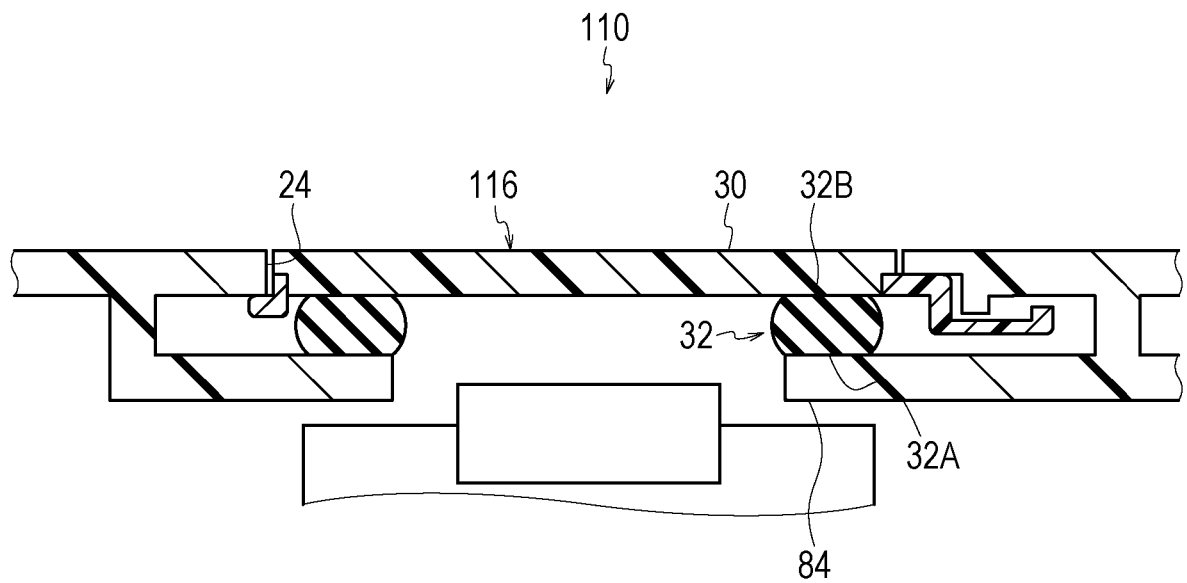
FIG. 9 is a cross-sectional view illustrating an electronic device to which a waterproof lid according to a comparative example is applied.

FIG. 9 illustrates an electronic device 110 to which a waterproof lid 116 according to the comparative example is applied. In this comparative example, the structure is different from that of the present embodiment in that the entirety of a proximal end portion 32B of a sealant 32 adheres to a lid body 30.

As in this comparative example, when the entirety of the proximal end portion 32B of the sealant 32 adheres to the lid body 30, the proximal end portion 32B (adhesive surface) of the sealant 32 is constrained in the width direction; accordingly, the repulsive force of the compressively deformed sealant 32 in the height direction becomes stronger while the waterproof lid 116 is closed. Therefore, an edge portion of an opening 24 and the lid body 30 are deformed by the repulsive force of the sealant 32 in the height direction and, as a result, there is a possibility that the waterproofness of the waterproof lid 116 is lowered.

Figure 10:
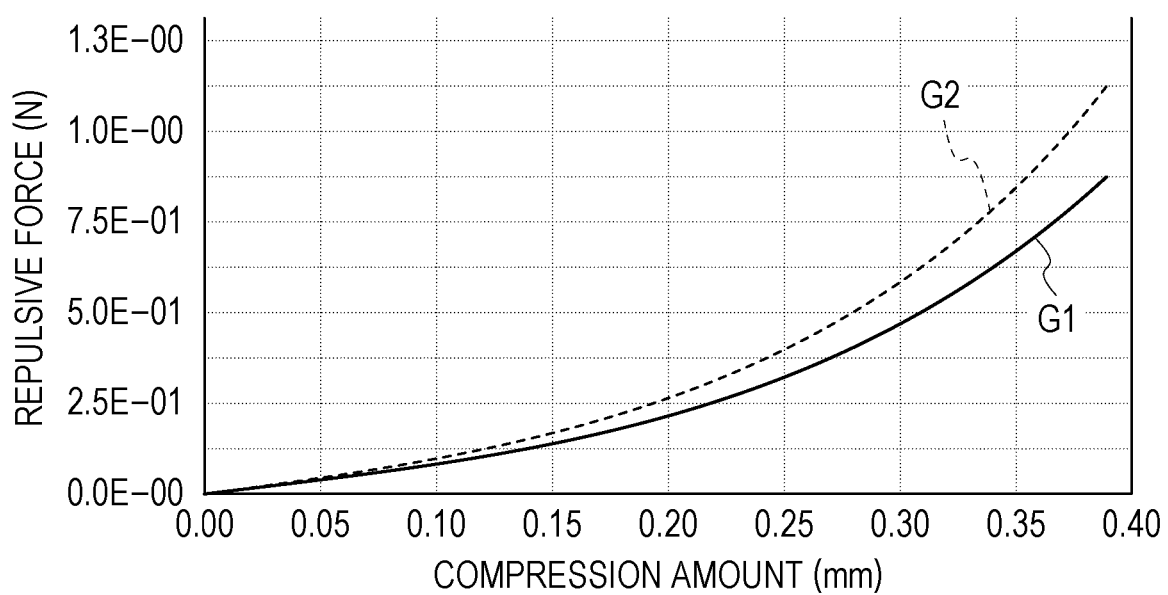
FIG. 10 is a graph comparing relationships between the compression amount and the repulsive force of the sealant in the present embodiment and the comparative example.

FIG. 10 illustrates a graph comparing relationships between the compression amount and the repulsive force of the sealant 32 in the present embodiment and the comparative example. A graph G1 illustrates the present embodiment, whereas a graph G2 illustrates the comparative example. As illustrated in FIG. 10, according to the present embodiment, it is understood that the repulsive force of the sealant 32 in the height direction is reduced as compared with the comparative example.

Figure 11:
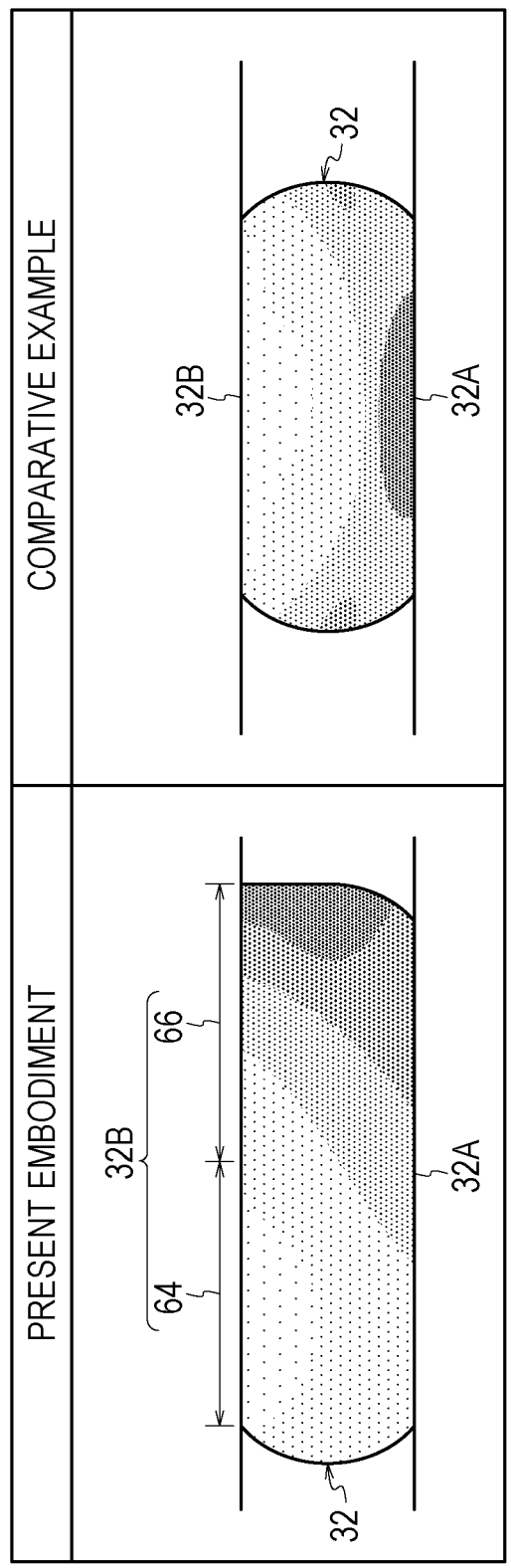
FIG. 11 is a diagram for comparing stress distributions at the time of compression of the sealant in the present embodiment and the comparative example.

FIG. 11 illustrates a diagram for comparing stress distributions at the time of compression of the sealant 32 in the present embodiment and the comparative example. FIG. 11 indicates that the darker the color of the sealant 32, the higher the stress. In the comparative example, the stress concentrates on the proximal end portion 32B and the distal end portion 32A of the sealant 32 in the height direction and the repulsive force of the sealant 32 in the height direction is kept strong. On the other hand, in the present embodiment, it is understood that the stress is biased in a portion of the sealant 32 deformed in the width direction, and stresses acting on the proximal end portion 32B and the distal end portion 32A of the sealant 32 in the height direction are relaxed.

By comparing the present embodiment and the comparative example as described above, it is understood that, according to the present embodiment, the repulsive force of the sealant 32 in the height direction may be reduced as compared with the comparative example. Therefore, the deformation of the edge portion of the opening 24 and the lid body 30 may be suppressed, such that it may be said that the waterproofness of the waterproof lid 16 may be improved as compared with the comparative example.

Next, modifications of the present embodiment will be described.

In the above embodiment, the electronic device 10 is, for example, a smartphone, but the electronic device 10 may be an electronic device other than the smartphone, such as a tablet terminal. Alternatively, the electronic device 10 may be an electronic device other than a thin electronic device such as a smartphone or a tablet terminal.

In the above embodiment, the connector 28 is, for example, a connector having a USB terminal, but the connector 28 may be a connector having a terminal other than the USB terminal, such as an earphone terminal.

In the above embodiment, the connector 28 is disposed to oppose the opening 24 from the inside of the casing 14, but a member, a structure, or the like other than the connector 28 may be disposed to oppose the opening 24.

In the above embodiment, the waterproof lid 16 is applied to a connector cover that covers the connector 28 as an example, but the waterproof lid 16 may be applied to a cover other than the connector cover, such as a battery cover that covers a battery pack.

In the above embodiment, the waterproof lid 16 is applied to the electronic device 10, but the waterproof lid 16 may be applied to a device other than the electronic device 10.

In the above embodiment, the width of the annular portion 38 is consistent over the entire circumference in the circumferential direction of the annular portion 38, but the width of the annular portion 38 may be enlarged or shortened in part of the annular portion 38 in the circumferential direction. In addition, the ratio of the widths of the first region 74 and the second region 76 may be varied by enlarging or shortening the width of the annular portion 38 in part of the annular portion 38 in the circumferential direction as described above.

In the above embodiment, the sealant 32 is formed in an elliptical shape in plan view, but the sealant 32 may be formed, for example, in a shape having a linear portion and a corner portion in plan view. When the sealant 32 is formed in a shape having a linear portion and a corner portion in plan view, the ratio of the widths of the first region 74 and the second region 76 may be varied such that the repulsive force becomes uniform between the linear portion and the corner portion.

In the above embodiment, the first region 74 and the first portion 64 are located on the inner circumferential side of the sealant 32 and the second region 76 and the second portion 66 are located on the outer circumferential side of the sealant 32. However, the first region 74 and the first portion 64 may be located on the outer circumferential side of the sealant 32 and the second region 76 and the second portion 66 may be located on the inner circumferential side of the sealant 32.

In the above embodiment, the first region 74 and the second region 76 are annular, but the first region 74 and the second region 76 may have a shape other than an annular shape. In addition, although the first portion 64 and the second portion 66 are formed over the entire circumference in the circumferential direction of the sealant 32, the first portion 64 and the second portion 66 may be formed only in a part of the sealant 32 in the circumferential direction. For example, the first portion 64 and the second portion 66 may be formed only in a range corresponding to at least one of the first holding portion 40 and the second holding portion 42 or may be formed only in a range corresponding to a corner portion of the sealant 32.

In the above embodiment, the sealant 32 is formed in an annular shape, but the sealant 32 may be formed in a shape other than an annular shape.

In the above embodiment, the first member 34 is formed of a material having adhesiveness to rubber and the second member 36 is formed of a material having non-adhesiveness to rubber. However, the first member 34 may be formed of a material having non-adhesiveness to rubber and the second member 36 may be formed of a material having adhesiveness to rubber. In addition, with this structure, the first region 74 having adhesiveness to rubber may be formed in the second member 36 and the second region 76 having non-adhesiveness to rubber may be formed in the first member 34.

In the above embodiment, the second member 36 has the first holding portion 40 and the second holding portion 42, but the second member 36 may have a structure for a purpose other than those of the first holding portion 40 and the second holding portion 42.

In the above embodiment, the lid body 30 has the first member 34 and the second member 36 formed of different materials, but the lid body 30 may be formed of a single material. In addition, in a case where the lid body 30 is formed of a single material, the first region 74 having adhesiveness to rubber and the second region 76 having non-adhesiveness to rubber may be formed in the lid body 30, for example, by conducting different surface treatments or the like.

In the above embodiment, an applied rubber curing type gasket formed of rubber is applied to the sealant 32, but a gasket other than the applied rubber curing type, such as a molded gasket may be applied. In addition, when a gasket other than the applied rubber curing type is applied to the sealant 32, a bonding treatment or the like for adhering the first portion 64 to the first region 74 may be carried out and additionally a surface treatment, a peeling work, or the like for bringing the second portion 66 into contact with the second region 76 in a non-adhesive state may be carried out.

In the above embodiment, the first region 74 and the second region 76 are formed in a planar shape, but the first region 74 and the second region 76 may be formed in a shape other than a planar shape.

Furthermore, among the plurality of above modifications, modifications that may be combined may be appropriately combined.

While the embodiments of the technique disclosed in the present application have been described thus far, the technique disclosed in the present application is not limited to the above embodiments and, in addition to the above embodiments, of course may be carried out by making various modifications without departing from the spirit of the invention.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A waterproof lid comprising:
a lid body; and
a sealant made of rubber and including a first portion which adheres to the lid body and a second portion is in contact with the lid body in a non-adhesive state.

2. The waterproof lid according to claim 1, wherein
the lid body includes a first region having adhesiveness to the rubber and a second region having non-adhesiveness to the rubber,
the first portion adheres to the first region, and
the second portion is in contact with the second region in the non-adhesive state.

3. The waterproof lid according to claim 2, wherein
the sealant is an applied rubber curing type gasket which is formed of the rubber.

4. The waterproof lid according to claim 2, wherein
the lid body includes a first member having a plate shape and a second member having a holding portion to be held by a casing of an electronic device,
one of the first region and the second region is formed in the first member, and
the other of the first region and the second region is formed in the second member.

5. The waterproof lid according to claim 2, wherein
the first portion adheres to the first region by integrating a boundary of the first portion and a boundary of the first region with each other, and
the second portion is in contact with the second region in the non-adhesive state by a separation between a boundary of the second portion and a boundary of the first region.

6. The waterproof lid according to claim 1, wherein
the lid body has a plate-like portion,
the sealant protrudes from the plate-like portion with a normal direction of the plate-like portion as a height direction, a proximal end portion of the sealant in the height direction includes the first portion and the second portion, and the second portion is adjacent to the first portion.

7. The waterproof lid according to claim 6, wherein a distal end portion of the sealant in the height direction has a convexly curved shape.

8. The waterproof lid according to claim 6, wherein in a case where a direction orthogonal to a protruding direction of the sealant is regarded as a width direction of the sealant when viewed in a circumferential direction of the sealant, the first portion is formed on one side in the width direction of the sealant, and the second portion is formed on the other side in the width direction of the sealant.

9. The waterproof lid according to claim 2, wherein a dividing line between the first region and the second region is annular, and the sealant is annular along the dividing line.

10. The waterproof lid according to claim 9, wherein the dividing line is located within a range in the width direction of the sealant.

11. The waterproof lid according to claim 9, wherein the first portion and the second portion are parallel to the dividing line.

12. The waterproof lid according to claim 9, wherein the first region and the first portion are located on an inner circumferential side of the sealant, and the second region and the second portion are located on an outer circumferential side of the sealant.

13. The waterproof lid according to claim 9, wherein the first region and the first portion are located on an outer circumferential side of the sealant, and the second region and the second portion are located on an inner circumferential side of the sealant.

14. An electronic device comprising:

a casing including an opening; and a waterproof lid provided in the opening, wherein the waterproof lid includes:

a lid body; and a sealant made of rubber and including a first portion which adheres to the lid body and a second portion which is in contact with the lid body in a non-adhesive state, the sealant being pressed against an edge portion of the opening.

* * * * *